United States Patent
Xu et al.

(10) Patent No.: US 7,339,282 B2
(45) Date of Patent: Mar. 4, 2008

(54) TOPOGRAPHICALLY INDEXED SUPPORT SUBSTRATES

(75) Inventors: Juntao Xu, Ames, IA (US); Curtis Mosher, Ames, IA (US); Michael P. Lynch, Ames, IA (US)

(73) Assignee: Bioforce Nanosciences, Inc., Ames, IA (US)

( * ) Notice: Subject to any disclaimer, the term of this patent is extended or adjusted under 35 U.S.C. 154(b) by 0 days.

(21) Appl. No.: 11/328,783

(22) Filed: Jan. 10, 2006

(65) Prior Publication Data

US 2006/0157873 A1  Jul. 20, 2006
US 2007/0152351 A9  Jul. 5, 2007

Related U.S. Application Data

(60) Provisional application No. 60/642,541, filed on Jan. 10, 2005.

(51) Int. Cl.
*G03F 9/00* (2006.01)
*G03F 7/20* (2006.01)
*H01L 23/544* (2006.01)
*H01L 21/76* (2006.01)
*H01L 21/70* (2006.01)

(52) U.S. Cl. ............... 257/797; 257/E23.02; 257/668; 430/394; 430/22; 430/5; 356/399; 356/401

(58) Field of Classification Search .......... 257/E23.02, 257/797, 668; 430/394, 22, 5; 356/399, 356/401

See application file for complete search history.

(56) References Cited

U.S. PATENT DOCUMENTS

| | | | |
|---|---|---|---|
| 3,508,215 A * | 4/1970 | Rubinstein et al. ........... 365/50 |
| 4,110,838 A * | 8/1978 | Noe ............................. 365/2 |
| 4,728,591 A | 3/1988 | Clark et al. |
| 5,077,085 A | 12/1991 | Schnur et al. |
| 5,436,758 A * | 7/1995 | Agostinelli et al. ......... 359/332 |
| 6,368,838 B1 | 4/2002 | Singhvi et al. |
| 6,559,915 B1 * | 5/2003 | Amimori et al. ........... 349/112 |
| 2004/0142106 A1 * | 7/2004 | Mirkin et al. ............... 427/256 |
| 2005/0221081 A1 * | 10/2005 | Liu et al. .................... 428/338 |
| 2006/0216910 A1 * | 9/2006 | Katz et al. .................. 438/458 |

* cited by examiner

*Primary Examiner*—Alexander Oscar Williams
(74) *Attorney, Agent, or Firm*—Michael Best & Friedrich LLP

(57) ABSTRACT

The present invention provides an indexed support substrate. The support substrate comprises at least one set of indexing features that are distinguishable from one another and from the surrounding substrate. The support substrate also comprises a set of useful domains. The indexing features are positioned on the substrate in such a way as to correspond to the useful domains in an identifying fashion.

38 Claims, 4 Drawing Sheets

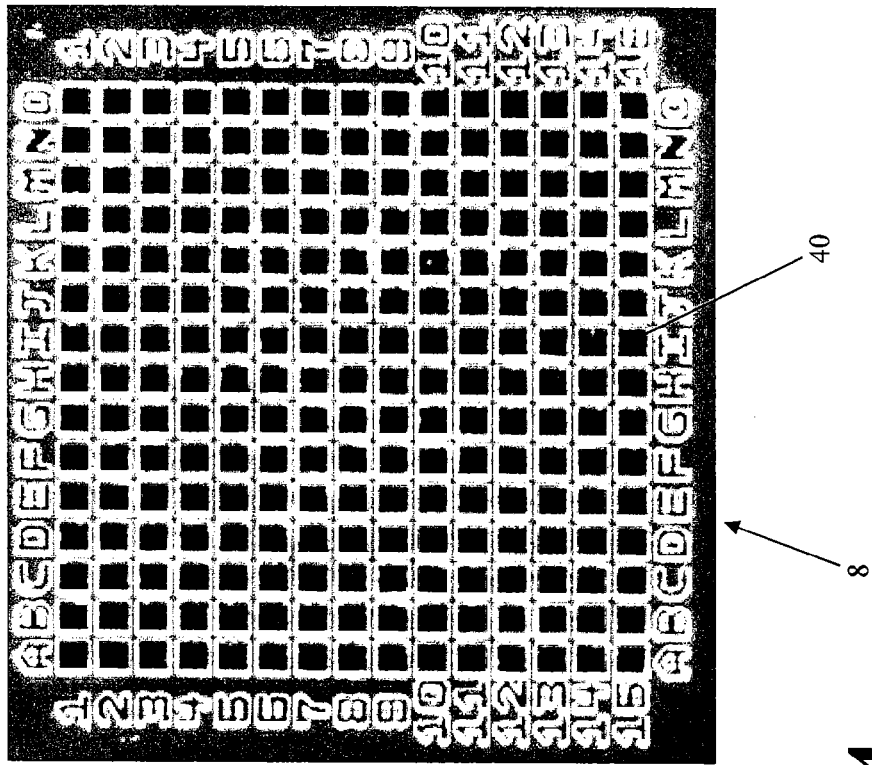
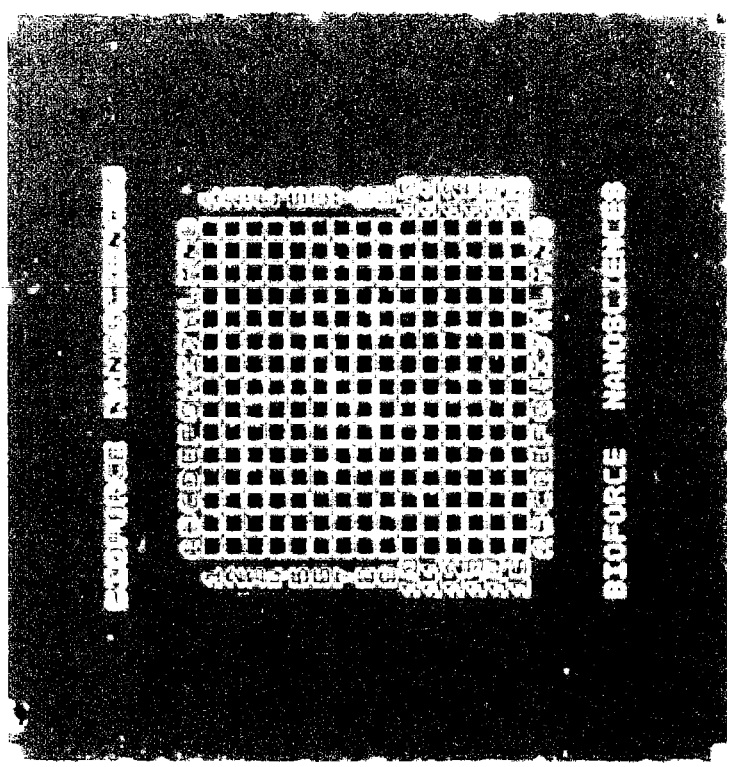
FIG. 4

TOPOGRAPHICALLY INDEXED SUPPORT SUBSTRATES

CROSS-REFERENCE TO RELATED APPLICATIONS

This application claims the benefit of the filing date of U.S. Provisional Patent Application No. 60/642,541 filed Jan. 10, 2005, the application being incorporated by reference in its entirety.

BACKGROUND OF THE INVENTION

The use of small substrates to bind chemical and biological material is widely used in the nanotechnology industry. Such small substrates, however, present a problem in identifying specific domains on the substrates, that may have different properties. This is especially the case if a substrate is moved from one machine to another so analysis can be done on the materials bound to the substrate.

SUMMARY OF THE INVENTION

The present invention provides an indexed support substrate. The support substrate comprises at least one set of indexing features that are distinguishable from one another and from the surrounding substrate. The support substrate also comprises a set of useful domains. The indexing features are positioned on the substrate in such a way as to correspond to the useful domains in an identifying fashion.

The support substrate is suitably silica, but can be made from any suitable material.

A useful domain is an area on the surface of the substrate that may be used for some function, and which may be located with reference to the indexing features.

In one embodiment, the support substrate comprises a set of indexing marks and a set of useful domain areas, wherein each indexing mark is associated with a specific row or column of useful domains areas.

The indexing marks can differ from each other by shape, size or topography, or can differ from each other chemically or magnetically. The indexed marks can also differ from the support substrate in shape, size and topography, chemically or magnetically. The indexing marks can either be deposited on the support substrate, or be created by removing material from the support substrate.

Each indexed mark is suitably less than 1000 microns$^2$ in area, or more suitably less than 100 microns$^2$ in area. Similarly, the area of each useful domain is suitably less than 1000 microns$^2$, or less than 100 microns$^2$, or less than 10 microns$^2$ or less than 1 microns$^2$.

The useful domain areas can simply be designated areas on the support substrate, or the areas can have different physical and chemical properties from the support substrate. The support substrate can additionally have a set of domain area markers that individually surround each of the useful domain areas.

BRIEF DESCRIPTION OF THE DRAWINGS

FIG. 4 shows a low and high magnification of a silicon support substrate that has the index markings and useful domains.

Figure 1:
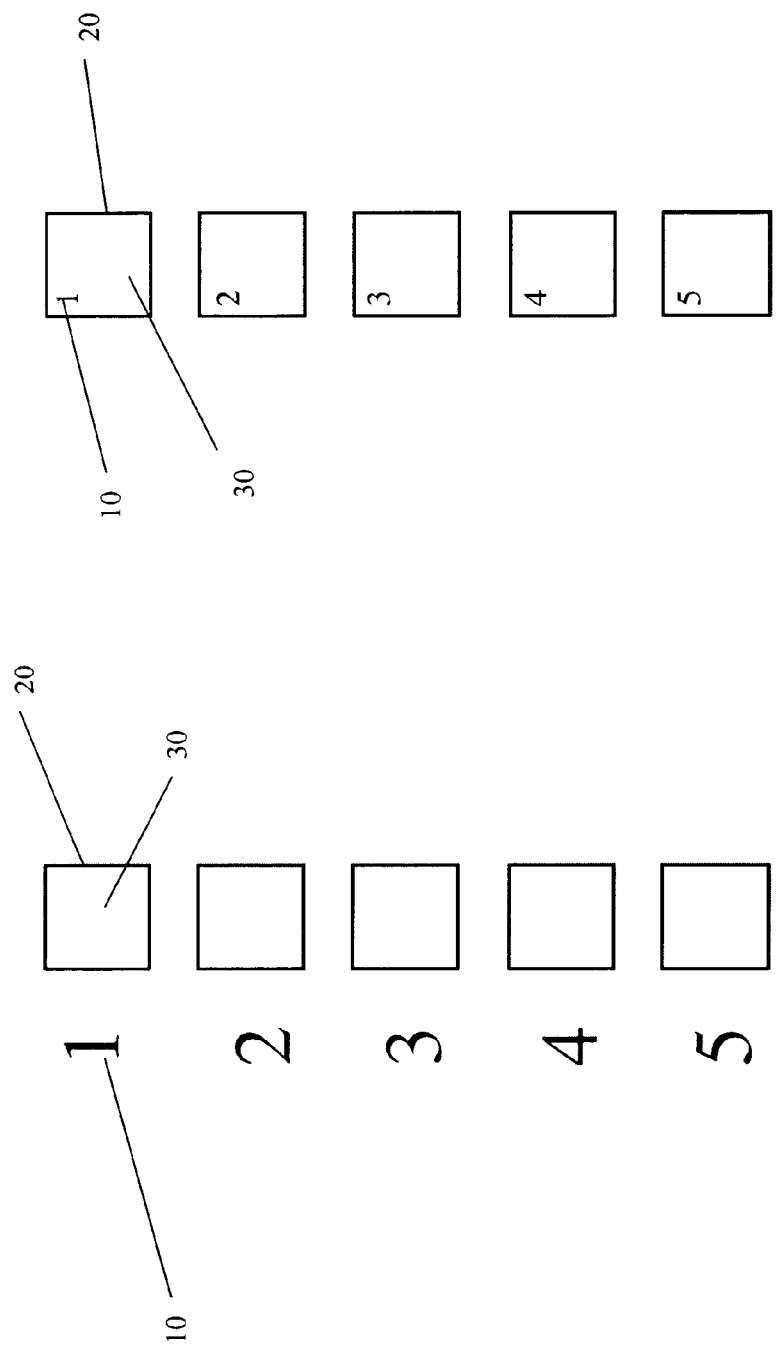
FIG. 1 is one embodiment of the organization of the index markings and useful domain area markings of the present invention.

Before the embodiments of the invention are explained in detail, it is to be understood that the invention is not limited in its application to the details of construction and the arrangements of the components set forth in the following description or illustrated in the drawings. The invention is capable of other embodiments and of being practiced or being carried out in various ways. Also, it is understood that the phraseology and terminology used herein are for the purpose of description and should not be regarded as limiting. The use of "including", "having" and "comprising" and variations thereof herein is meant to encompass the items listed thereafter and equivalents thereof as well as additional items and equivalents thereof.

It also is understood that any numerical value recited herein includes all values from the lower value to the upper value. For example, if an area range is stated as 1 to 100 microns$^2$, it is intended that values such as 2 to 40 microns$^2$, 10 to 30 microns$^2$ or 1 to 3 microns$^2$, etc., are expressly enumerated in this specification. These are only examples of what is specifically intended, and all possible combinations of numerical values between the lowest value and the highest value enumerated are to be considered to be expressly stated in this application.

DETAILED DESCRIPTION OF THE INVENTION

The present invention provides an indexed support substrate. The support substrate comprises at least one set of indexing features that are distinguishable from one another and from the surrounding substrate. The support substrate also comprises a set of useful domains. The useful domains may also be marked by domain area markers that individually surround each useful domain. The indexing features are positioned on the substrate in such a way as to correspond to the useful domains in an identifying fashion. The indexing marks and useful domains can be coplanar with each other, and can be coplanar with the surrounding substrate.

A useful domain is an area on the surface of the substrate that may be used for some function, and which may be located with reference to the indexing features.

An indexing feature is a recognizable mark that permits location and identification of a useful domain. "Indexing features" and "indexing marks" may be used interchangeably. Suitably each indexed mark is suitably less than 1000 microns$^2$ in area, and more suitably less than 100 microns$^2$ in area, or less than 100 microns$^2$ in area, or less than 10 microns$^2$ in area or less than 1 microns$^2$ in area. Also, the indexing marks can be between 1-10 microns$^2$ in area, between 10-100 microns$^2$ in area, or between 100-1000 microns$^2$ in area.

Indexing features and useful domains markers may be formed simultaneously or sequentially by any number of methods known to those of ordinary skill in the art. These methods include, but are not limited, to photolithography/e-beam lithography followed by reactive ion etching (RIE), deep reactive ion etching (DRIE), dry etching, ion milling, wet etching, metal deposition and lift-off, shadow mask deposition, laser direct writing, electron beam or ion beam direct writing, electric discharge machining, contact printing, microstereolithography, stamping or molding, Fluidics Enabled Material Transfer Operation (FEMTO) and injection molding. Indexing features and useful domains may be created by either an etching (material removal) or deposition (material addition) process.

The support substrates themselves can be any suitable material, including silica. Other suitable materials include, but are not limited to, glass, pyrex, borofloat, quartz, fused silica, silicon, silicon oxide, silicon nitride, gallium arsenide, gallium phosphide, gallium nitride germanium, sapphire, indium phosphide, zinc oxide, silicon carbide, ceramics, plastics, polymers, polydiethylsiloxane (PDMS), poly(methylmethacrylate), SU8, polystyrene, polypropylene, polyethelyne, or other materials suitable for use in semiconductor, plastics, glass, ceramics and manufacturing industries. The support substrate may also have a top layer of metal 40 (FIG. 4). Suitable metals include gold, silver, platinum, copper, nickel, chromium titanium, indium, tantalum, tin, zinc, aluminum, scandium, palladium, tungsten, or lead, or oxides or alloys thereof.

The indexed support substrate may also be covered with a layer of either a positive or negative resist. Physical removal of a resist may subsequently be performed using any of a number of techniques, including, but not limited to, AFM nanolithography. Alternatively, a positive or negative photoresist may be applied to the support substrate and subsequently exposed to UV light. The UV light may be directed to the surface using any of a number of techniques including, but not limited to, scanning near-field optical microscopy.

In one embodiment, the indexed support substrate includes optically distinguishable indexing features and has substantially flat, smooth useful domains. Indexing features may comprise letters, numbers, symbols, or other recognizable shapes. The flatness and smoothness of the useful domains may be achieved by any number of methods known to one of ordinary skill in the art including, but not limited to, mechanical polishing, chemical-mechanical polishing, electro-chemical polishing, and chemical treatment. In one embodiment, the useful domains should have sufficient flatness and smoothness to permit its use as a substrate for scanning probe microscopy, nanolithography, or other applications requiring a flat, smooth surface. The indexing features may be used to denote the address of a particular useful domain for future analysis or experimentation.

In another embodiment, the support substrate comprises indexing features that are distinguishable by a non-optical method. These indexing systems can use a variety of other physical or electromagnetic methods for visualization. In one embodiment an oxidation procedure may be used to create an indexing system that is defined by regions of oxidized, and hence hydrophilic, regions with interspersed less oxidized or native, and hence hydrophobic, deposition domains. The inverse may also be generated. These indexing patterns can be visualized by friction measurements with an atomic force microscope.

In another embodiment, the indexing markers and useful domain markers can be created by local magnetization of a magnatizable surface coating. This type of indexing pattern can be visualized by a scanning probe microscope that is capable of detecting local magnetic domains.

In another embodiment, the indexing markers and useful domain markers are chemically distinguished. In one embodiment this is done by the elastomeric stamping of chemical groups on a surface. The chemical nature of these groups would distinguish them from the adjacent areas, thereby creating the indexing grid system. This type of indexing system can be visualized by a variety of methods including but not limited to lateral force (friction), chemical force (using a chemically sensitized scanning probe) or direct force mapping (using an atomic force microscope to measure adhesion or other forces at defined locations on the surface).

The useful domains of the indexed support substrate can be customized to meet a variety of needs and purposes. Suitably the area of the useful domains is less than 1000 microns$^2$, or in the alternative less than 100 microns$^2$, less than 10 microns$^2$ or less than 1 microns$^2$. The amount of useful domains on a substrate can be any amount, but is suitably between 1-1000.

The useful domains can be substantially flat or can have a rough surface depending on what is required. When a rough surface is required, the useful domains suitably have a root mean squared roughness of less than 100 nm, or in the alternative less than 10 nm, less than 1 nm or less than 0.1 nm. Also, the root mean squared roughness may suitably be in any range between 0.1-100 nm.

In one embodiment, the useful domains of the indexed support substrate can be used as a substrate for lithography. Many methods of lithography, including, but not limited to, dip pen nanolithography, nanografting, dip pen nanografting, soft lithography, microcontact printing, Fluidics Enabled Material Transfer Operation (FEMTO), and direct physical deposition require flat surfaces for optimal results. Support substrates may be used for lithographic purposes in their native state, functionalized with a chemical reagent (e.g. silanes), coated with metal, or modified in any other way known to one of ordinary skill in the art.

In another embodiment, the useful domains of this indexed support substrate can be used as a substrate for any of the techniques generally referred to as scanning probe microscopy (SPM). These include, but are not limited to, scanning tunneling microscopy, atomic force microscopy (AFM), lateral force microscopy, chemical force microscopy, shear force microscopy, dynamic force microscopy, magnetic force microscopy, phase detection microscopy, electrostatic force microscopy, thermal scanning microscopy, scanning capacitance microscopy, and near-field scanning optical microscopy. These applications frequently require an extremely flat surface for optimal results. Individual useful domains or regions within these domains may be functionalized with an affinity agent prior to use or the entire substrate may possess the same relative affinity. In this embodiment, a sample containing molecules or particles of interest is exposed to the support substrate under conditions that will promote binding of the molecules or particles to the surface. Scanning probe microscopy may subsequently be performed on the useful domains of the substrate. Domains of interest may be denoted by the corresponding indexing features. In the event that the support substrate is removed from the analytical instrument, the useful domains of interest may be located again using the previously denoted indexing features.

Optionally, the indexed support substrate and/or the useful domains may be coated with gold or some other metal. A self-assembling monolayer of alkanethiolate molecules can then be applied to the substrate to produce a surface having defined chemical properties. These properties may be selected to achieve any of a number of goals, including, but not limited to, allowing covalent binding of biomolecules, or reducing non-specific binding of biomolecules. A monolayer of covalently bound molecules may subsequently be employed to facilitate the binding of additional biomolecular species. Appropriate monolayer materials include, but are not limited to, chemicals with the general formula S—(CH$_2$)$_x$—R, where S represents a sulfur atom, X is an integer in the range of from 1 to 30, and R is selected from the group consisting of $CH_3$, $NH_2$, $NH_3$, O, P, succinimide, OH, COOH, epoxide, aldehyde, crown ether, ether, glycol, ethylene, and atomic metals. Other R groups may be included and the examples shown here are intended to be representative, but not limit the scope of the invention.

Another embodiment includes an indexed support substrate and/or useful domains comprising a lipid bilayer applied to the top surface. The lipid bilayer may be designed to simulate a cellular membrane. Membrane proteins may be embedded in such a lipid bilayer for subsequent analysis or experimentation. Alternatively, an actual biological membrane may be isolated with native membrane proteins intact and deposited upon, or used to coat, the useful domain(s) of the substrate.

In another embodiment, the useful domains of an indexed substrate may be used as a support for cell growth. The surface may be functionalized with a molecule that promotes cell adhesion, such as the tetrapeptide Arg-Gly-Asp-Ser (RGDS), which interacts with beta integrin. This would permit cells to be grown on the substrate and observed through a number of techniques. Cells of interest may be denoted by the indexing features corresponding to the useful domain at which they are located.

In another embodiment, the support substrate comprises useful domains that are isolated, individually driven and monitored quartz crystal microbalances (QCM). Each domain is uniquely functionalized with chemical or biological affinity reagents such that they will bind, react with, or become modified upon exposure to a given analyte. These changes can be recorded as a change in the resonating frequency of the particular QCM/useful domain.

FIG. 1 shows a diagram of useful domains 30 useful domain markers 20 and indexing features 10 in which each useful domain is identified by a single indexing feature 10 (a number). The left hand panel shows indexing features 10 adjacent to each useful domain 30. The right hand panel shows indexing features integrated into each useful domain.

Figure 2:
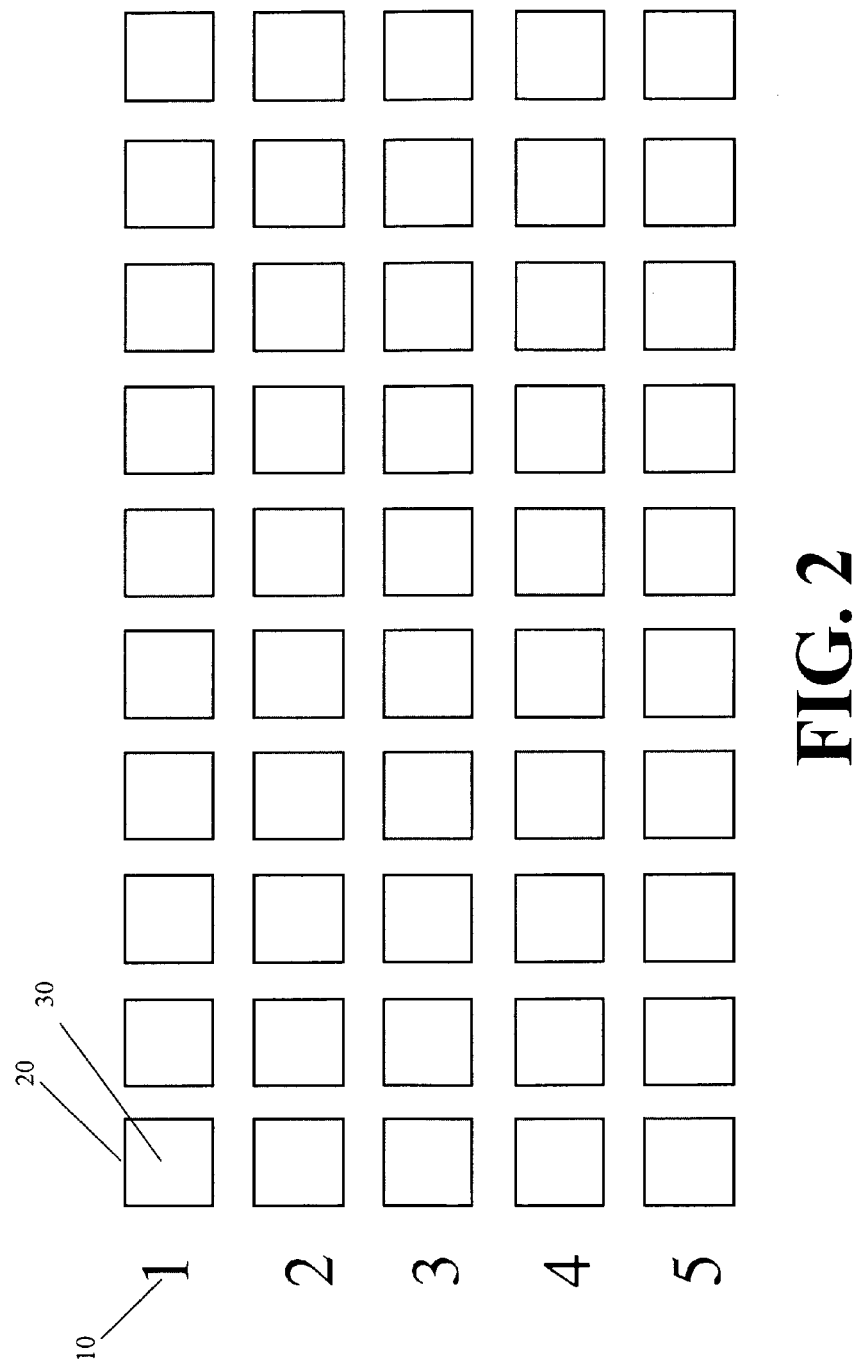
FIG. 2 is another embodiment of the organization of the index markings and useful domain area markings of the present invention.

FIG. 2 shows a two dimensional array of indexing features 10 and useful domains 30. In this case, a two dimensional coordinate system may be used to locate and identify useful domains 30 within the array.

Figure 3:
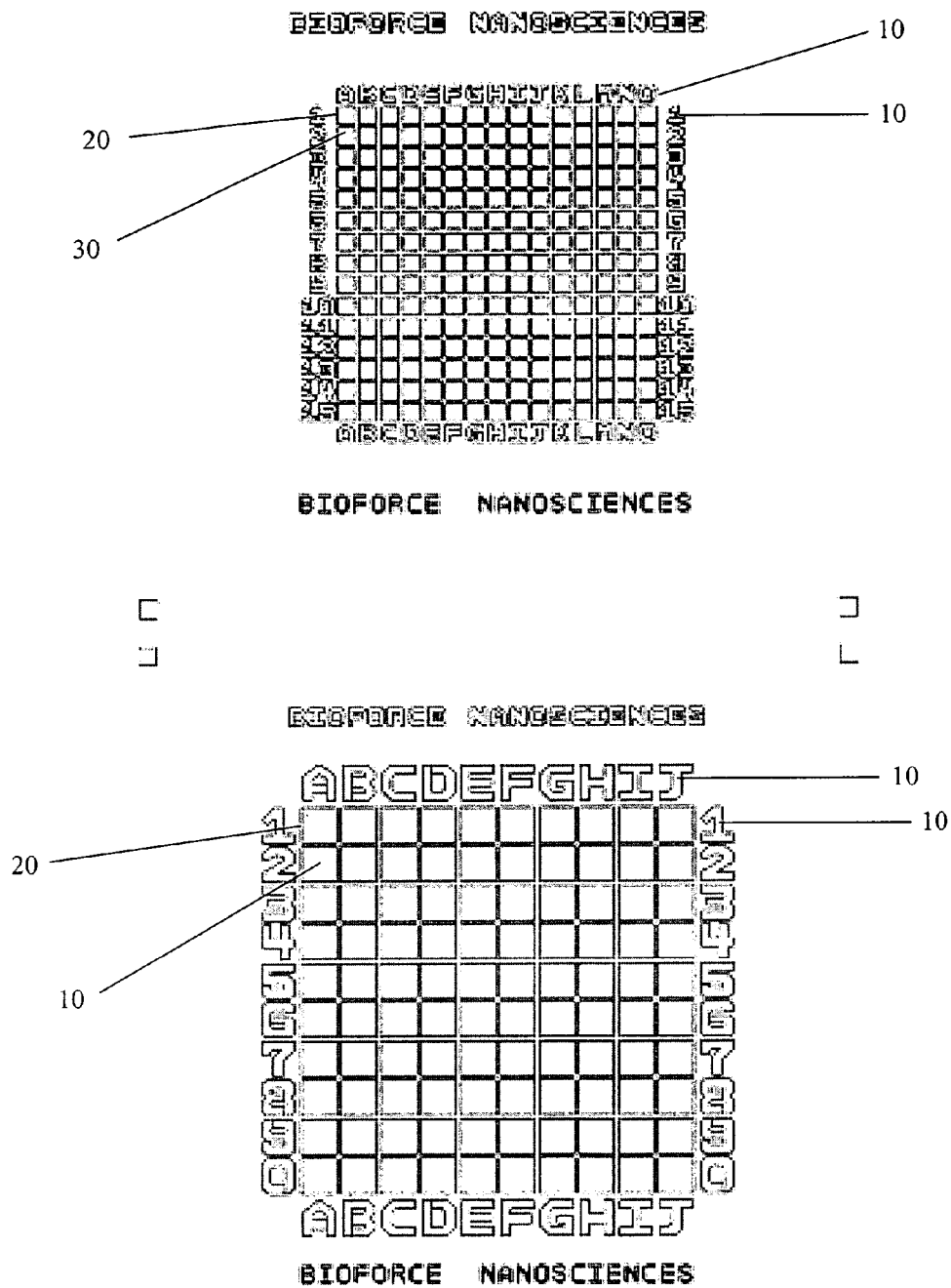
FIG. 3 shows examples of indexed support substrates.

FIG. 3 shows examples of the markings of an indexed support substrate. A photolithographic process was used to create surfaces with raised indexing features and useful domains. In the upper panel, the indexed chip fabricated as described below in Example 1 had dimensions of 4 mm×4 mm×0.48 mm. The photomask provided a pattern that was a 15×15 100 μm square pad array (120 μm pitch) with column indices from A to O and row indices from 1 to 15. In the lower panel, the indexed chip fabricated as described below in Example 1 had dimensions of 4 mm×4 mm×0.48 mm. The photomask provided a pattern that was a 10×10 200 μm square pad array (220 μm pitch) with column indices from A to J and row indices from 1 to 10. The etching depth was 200 nm, which provided sufficient contrast to permit visualization using an optical microscope. FIG. 4 shows similar indexed support substrates 8.

EXAMPLE 1

Making an Indexed Support Substrate

Summary of Procedure

The procedure described below was used to fabricate 4×4 mm silicon chips with etched pads array and alpha-numeric indices to identify each pad. The surface of pads remained untouched (i.e., the surface of each pad was the original silicon surface). Therefore, chips made by this method are suitable for AFM imaging, having on the order of 1 nm root mean square surface roughness.

The wafer was first cleaned by the standard clean-1 and standard clean 22 procedures developed by Werner Kern at RCA laboratories in the late 1960's (RCA) the standard cleaning process detailed below. The wafer was then coated with positive photoresist and exposed in ultraviolet (UV) light using a pre-made photomask. The pattern on the photomask was transferred onto the photoresist. After developing, the photoresist pattern was used as hard mask to etch the exposed area of silicon in RIE machine. The photoresist protected silicon area remained untouched and embossed on the wafer surface. After post cleaning, the etched wafer was coated with a thin layer of photoresist for dicing. A UV tape was adhered to the back of the whole wafer to hold the chips during the dicing process. Chips were subsequently released from the UV tape by exposure to UV light. Individual chips were cleaned by sequentially soaking and rinsing in acetone, ethanol and dionized (DI) water. Finally, the chip was $O_2$ plasma treated to remove the photoresist.

Procedure Protocol

Starting material: Silicon wafer (Silicon Valley Microelectronics, Inc.), Diameter: 100 mm+/−0.5 mm, Type/Dopant: N/Phosphorus or P/Boron, Orientation: <111> or <100>, Resistivity: 0.01-100 Ohm·cm, Thickness: 350-500 microns, Front Surface: Polished Inedexed Support Substrate Fabrication 1) Pre-cleaning The silicon wafers were precleaned using appropriate safety precautions in the following sequence: RCA-1→HF dip→RCA-2→DI water rinsing→Spin dry, as detailed immediately below. Precleaning may be optionally omitted when using wafers newly received from the Semiconductor Company with qualified package sealing.

RCA-1:

Wafers were soaked in 1:1:5 of $NH_4OH$ (27%): $H_2O_2$ (30%): $H_2O$ 70° C. bath for 30 minutes.

HF Dip:

Wafers were dipped in HF acid for 10 seconds until silicon de-wets RCA-2:

Wafers were soaked in 1:1:6 of HCl (37%): $H_2O_2$ (30%): $H_2O$ 70° C. bath for 30 minutes DI Water Rinsing:

Wafers were soaked in a container with overflowing DI water from a tap to rinse and remove the RCA solution.

Spin Dry:

Wafers were placed in a spin rinser and dryer to dry wafers

2) Photolithography (a) Wafers were pre-baked for 30~90 seconds at 115° C. on a hot plate with the wafer face up.

(b) The pre-baked wafer was placed in an hexamethyldisilazane (HMDS) vapor tank for 3 minutes.

(c) The wafer was spin coated with positive Shipley 1813 photoresist at spin speed of 3000 rpm for 30 seconds to achieve a photoresist thickness of about 1.3 μm.

(d) The wafer was soft baked for 30~60 seconds on a 105° C. hot plate.

(e) The wafer was exposed on a Karl Suss MABA6 aligner using chip photomask. Exposure was performed at hard contact mode using 15 μm gap and 7 seconds exposure time (UV intensity: 12 mJ/$cm^2$).

(f) The wafer was developed using Shipley 351 photoresist developer for 15 seconds.

(g) The wafer was rinsed in a container with overflowing DI water from a tap for 30 minutes and blown dry using a nitrogen gun.

(h) The wafer was hard baked for 30~90 seconds at 120° C. on a hot plate.

3) Reactive Ion Etching

Wafers were placed onto the central region of the stage of STS RIE machine (maximum put four) to etch silicon for 20 minutes.

The process formulation includes $CF_4$ (40 standard cubic centimeters per minute (SCCM), $O_2$ (4 SCCM) at 100 mTorr and 50 W.

Etching depth is about 200 nm.

4) Post Cleaning

The wafer was sonicated in acetone at high power for 10 minutes. The wafer was then soaked in acetone for 15 minutes, followed by submersion in methanol for 15 minutes, and treated with IPA for 10 minutes. The wafer was rinsed in running DI water for 30 minutes, spun dry and treated in an $O_2$ plasma asher for 3 minutes at 300 W 5) Dicing (a) The wafer was spin coated 1 μm thick Shipley 1813 at 3000 rpm for 30 seconds.

(b) The wafer was diced into 4×4 mm chips. UV tape is applied to the back of the wafer to adhere chips during the dicing. Following dicing, chips were released from tape by exposure in UV light.

6) Chip Cleaning

The chips were carefully peeled from the UV tape and (a) The chips were soaked in acetone for 30 minutes.

(b) The chips were sonicated in acetone for 10 minutes, ethanol for 10 minutes and DI water for 10 minutes. The chips were then blown dry with pure nitrogen gas.

(c) The chips were treated in an $O_2$ plasma asher for 5 minutes at 350 W

While the present invention has now been described and exemplified with some specificity, those skilled in the art will appreciate the various modifications, including variations, additions, and omissions that may be made in what has been described. Accordingly, it is intended that these modifications also be encompassed by the present invention and that the scope of the present invention be limited solely by the broadest interpretation that lawfully can be accorded the appended claims.

What is claimed is:

1. A support substrate having a set of indexing marks and a set of useful domain areas, wherein each indexing mark is associated with a specific row or column of useful domains areas and wherein the indexing marks correspond to the useful domain areas in an identifying fashion.

2. The support substrate of claim 1 wherein indexing marks differ from each other by shape, size or topography.

3. The support substrate of claim 1 wherein the indexing marks differ from each other chemically.

4. The support substrate of claim 1 wherein the indexing marks differ from each other magnetically.

5. The support substrate of claim 1 wherein the indexing marks differ from the substrate chemically.

6. The support substrate of claim 1 wherein the indexing marks differ from the substrate magnetically.

7. The support substrate of claim 1 wherein the substrate further has a set of domain area markers that individually surround each of the useful domain areas.

8. The support substrate of claim 1 wherein the each indexing mark is no greater than 100 microns$^2$ in area.

9. The support substrate of claim 1 wherein the each indexing mark is between 100-1000 microns in area.

10. The substrate of claim 1, wherein the set of indexing marks are deposited on the support substrate.

11. The substrate of claim 1, wherein the set of indexing marks were created by removing material from the support substrate.

12. The substrate of claim 1, wherein the area of each useful domain is less than 1000 microns$^2$.

13. The substrate of claim 12, wherein the area of each useful domain is less than 100 microns$^2$.

14. The substrate of claim 13, wherein the area of each useful domain is less than 10 microns$^2$.

15. The substrate of claim 14, wherein the second set of useful domains is comprised of domains smaller than 1 micron$^2$.

16. The substrate of claim 1, wherein the useful domains have a root mean squared roughness of between than 100 nm and 0.1 nm.

17. The substrate of claim 1, wherein the substrate material is glass, pyrex, borofloat, quartz, fused silica, silicon, silicon oxide, silicon nitride, gallium arsenide, gallium phosphide, gallium nitride, germanium, sapphire, indium phosphide, zinc oxide, silicon carbide ceramics, plastics, polymers, polydiethylsiloxane (PDMS), SU8, polystyrene, polypropylene, or polyethelyne.

18. The substrate of claim 17, wherein the support substrate further comprises a top layer of metal.

19. The substrate of claim 18, wherein the metal comprises at least one of gold, silver, platinum, copper, nickel, chromium, titanium, indium, tantalum, tin, zinc, aluminum, scandium, palladium, tungsten, or lead, or oxides or alloys thereof.

20. A support substrate having a set of indexing marks and a set of useful domain areas, wherein each indexing mark is associated with a specific row or column of useful domains areas and wherein the indexing marks correspond to the useful domain areas in an identifying fashion, and wherein each indexing mark is less than 1000 microns$^2$ in area, and wherein the area of each useful domain is less than 1000 microns$^2$.

21. The support substrate of claim 20 wherein indexing marks differ from each other by shape, size or topography.

22. The support substrate of claim 20 wherein the indexing marks differ from each other chemically.

23. The support substrate of claim 20 wherein the indexing marks differ from each other magnetically.

24. The support substrate of claim 20 wherein the indexing marks differ from the substrate chemically.

25. The support substrate of claim 20 wherein the indexing marks differ from the substrate magnetically.

26. The support substrate of claim 20 wherein the substrate further has a set of domain area markers that individually surround each of the useful domain areas.

27. The support substrate of claim 20 wherein the each indexing mark is no greater than 100 microns$^2$ in area.

28. The support substrate of claim 20 wherein the each indexing mark is between 100-1000 microns$^2$ in area.

29. The substrate of claim 20, wherein the set of indexing marks are deposited on the support substrate.

30. The substrate of claim 20, wherein the set of indexing marks were created by removing material from the support substrate.

31. The substrate of claim 20, wherein the area of each useful domain is less than 100 microns$^2$.

32. The substrate of claim 31, wherein the area of each useful domain is less than 10 microns$^2$.

33. The substrate of claim 32, wherein the second set of useful domains is comprised of domains smaller than 1 micron$^2$.

34. The substrate of claim 20, wherein the useful domains have a root mean squared roughness of between than 100 nm and 0.1 nm.

35. The substrate of claim 20, wherein the substrate material is glass, pyrex, borofloat, quartz, fused silica, silicon, silicon oxide, silicon nitride, gallium arsenide, gallium phosphide, gallium nitride, germanium, sapphire, indium phosphide, zinc oxide, silicon carbide, ceramics, plastics, polymers, polydiethylsiloxane (PDMS), SU8, polystyrene, polypropylene, or polyethelyne.

36. The substrate of claim 35, wherein the support substrate further comprises a top layer of metal.

37. The substrate of claim 36, wherein the metal comprises at least one of gold, silver, platinum, copper, nickel, chromium, titanium, indium, tantalum, tin, zinc, aluminum scandium, palladium, tungsten, or lead, or oxides or alloys thereof.

38. The substrate of claim 36 wherein each useful domain area further comprises a self-assembling monolayer comprised of molecules having the structure $S-(CH_2)_x-R$, where S represents a sulfur atom, X is an integer in the range of from 1 to 30, and R represents a functional group selected from the group consisting of $CH_3$, succinimide, OH, COOH, epoxide, aldehyde, crown ether, and ether.

* * * * *